(12) United States Patent
Chang

(10) Patent No.: US 12,407,314 B2
(45) Date of Patent: Sep. 2, 2025

(54) COMPENSATION METHOD FOR CHARACTERISTIC DIFFERENCE OF PHOTOELECTRIC ELEMENT

(71) Applicant: Teco Image Systems Co., Ltd., Taipei (TW)

(72) Inventor: Kuei-Chung Chang, Taipei (TW)

(73) Assignee: Teco Image Systems Co., Ltd., Taipei (TW)

( * ) Notice: Subject to any disclaimer, the term of this patent is extended or adjusted under 35 U.S.C. 154(b) by 407 days.

(21) Appl. No.: 18/080,179

(22) Filed: Dec. 13, 2022

(65) Prior Publication Data
US 2024/0178809 A1 May 30, 2024

(30) Foreign Application Priority Data
Nov. 29, 2022 (TW) ................................. 111145707

(51) Int. Cl.
*H03G 3/00* (2006.01)
*H03G 3/30* (2006.01)

(52) U.S. Cl.
CPC .......... *H03G 3/007* (2013.01); *H03G 3/3015* (2013.01); *H03G 2201/506* (2013.01); *H03G 2201/508* (2013.01)

(58) Field of Classification Search
CPC ................ H03G 3/007; H03G 3/3015; H03G 2201/506; H03G 2201/508
USPC ...................................................... 324/537
See application file for complete search history.

(56) References Cited

U.S. PATENT DOCUMENTS

| 6,623,297 B2 * | 9/2003 | Hwang | H01R 12/716 |
| | | | 439/604 |
| 10,039,163 B2 * | 7/2018 | Mishima | H05B 45/50 |

FOREIGN PATENT DOCUMENTS

| CN | 215181477 U | * | 12/2021 |
| JP | 2002334978 A | * | 11/2002 |
| JP | 2007116176 A | | 5/2007 |
| JP | 2012252216 A | | 12/2012 |
| JP | 2016170986 A | | 9/2016 |
| JP | 2018517240 A | | 6/2018 |
| TW | 201504654 A | | 2/2015 |
| TW | 202143623 A | | 11/2021 |
| WO | 2017124742 A1 | | 7/2017 |

* cited by examiner

Primary Examiner — Eman A Alkafawi
Assistant Examiner — Hugo Navarro
(74) Attorney, Agent, or Firm — KIRTON McCONKIE; Evan R. Witt

(57) ABSTRACT

A compensation method for a characteristic difference of a photoelectric element is disclosed. The method includes (S1) providing a test substrate with a connector, a photoelectric element and a plurality of gain units, wherein the plurality of gain units are connected in parallel; (S2) connecting the connector to a test fixture which includes a test resistor and a test control unit, wherein when the test fixture is connected with the connector, the test resistor is electrically connected between the second pin and the third pin; (S3) providing input power to the connector so as to generate a test voltage on the photoelectric element; (S4) selecting the corresponding gain unit according to the test voltage and a classification data table; (S5) driving a production line to connect the first contact and the second contact of the selected gain unit.

6 Claims, 2 Drawing Sheets

140
COMPENSATION METHOD FOR CHARACTERISTIC DIFFERENCE OF PHOTOELECTRIC ELEMENT

FIELD OF THE INVENTION

The present invention relates to a field of photoelectric elements, and more particularly to a compensation method for characteristic differences of photoelectric elements.

BACKGROUND OF THE INVENTION

Photoelectric elements, for examples LEDs or light sensors, have been widely used in various electronic circuits. Even if they are the same elements, the output signals of these same photoelectric elements are still different. A difference between a maximum value and a minimum value of the output signal recorded in specifications of some photoelectric elements can even reach 10 times so that the quality of the product is unstable. A processing method for this kind of photoelectric elements in the conventional technology is to measure all produced photoelectric elements by a photoelectric element production factory, and then carries out screening and classification according to output intensity of the photoelectric elements. For example, the LED screening and classification is performed based on a luminous intensity of the LED, and the photoelectric sensor screening and classification is performed based on a photocurrent intensity of the light sensor. Different codes (BIN codes) are assigned to the photoelectric elements according to the results of screening and classification. Customers specify the code to order according to the required output intensity when ordering the photoelectric elements.

With the trend of variety and small amount of products, more and more photoelectric element manufacturers cannot ensure that they can screen out enough quantities to meet the specified code in the customer order in a certain batch of produced photoelectric elements. Consequently, more and more photoelectric element manufacturers do not provide code classification services. Therefore, it is desired to provide a compensation method for characteristic differences of the photoelectric elements so as to overcome the characteristic difference between photoelectric elements and ensure the quality and stable operation of electronic equipment or systems.

SUMMARY OF THE INVENTION

An object of the present invention provides a compensation method for characteristic differences of the photoelectric elements. The compensation method utilizes the test fixture to generate the test voltage on the photoelectric element on the test substrate. The test fixture selects the corresponding gain unit from the plurality of the gain units according to the classification data table and the test voltage, and connects the first contact and the second contact of the disconnection port of the selected gain unit, so that a conduction is formed between the first contact and the second contact of the selected gain unit. The characteristic difference of the photoelectric element is compensated by using the gain resistor of the selected gain unit, so as to overcome the characteristic difference between the photoelectric element and ensure the quality and the stable operation of the electronic equipment or the system.

In accordance with an aspect of the present invention, a compensation method for a characteristic difference of a photoelectric element is provided. The compensation method includes steps of: (S1) providing a test substrate, wherein the test substrate includes a connector, the photoelectric element and a plurality of gain units, wherein the photoelectric element is electrically connected with the connector, the connector includes a first pin, a second pin, a third pin and a fourth pin, and the plurality of gain units are electrically connected in parallel, wherein each of the plurality of gain units is electrically connected between the second pin and the third pin, and includes a gain resistor and a disconnection port, wherein the gain resistor is electrically connected to the disconnection port, the disconnection port includes a first contact and a second contact which are disconnected from each other; (S2) connecting the connector to the test fixture, wherein the test fixture includes a test resistor and a test control unit, wherein when the test fixture is connected with the connector, the test resistor is electrically connected between the second pin and the third pin; (S3) providing the input power to the connector by the test fixture so as to generate a test voltage on the photoelectric element by using the input power; (S4) selecting the corresponding gain unit from the plurality of gain units by the test control unit according to the test voltage and a classification data table; and (S5) driving a production line to connect the first contact and the second contact of the disconnection port of the selected gain unit by the test control unit so that a conduction is formed between the first contact and the second contact of the selected gain unit.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
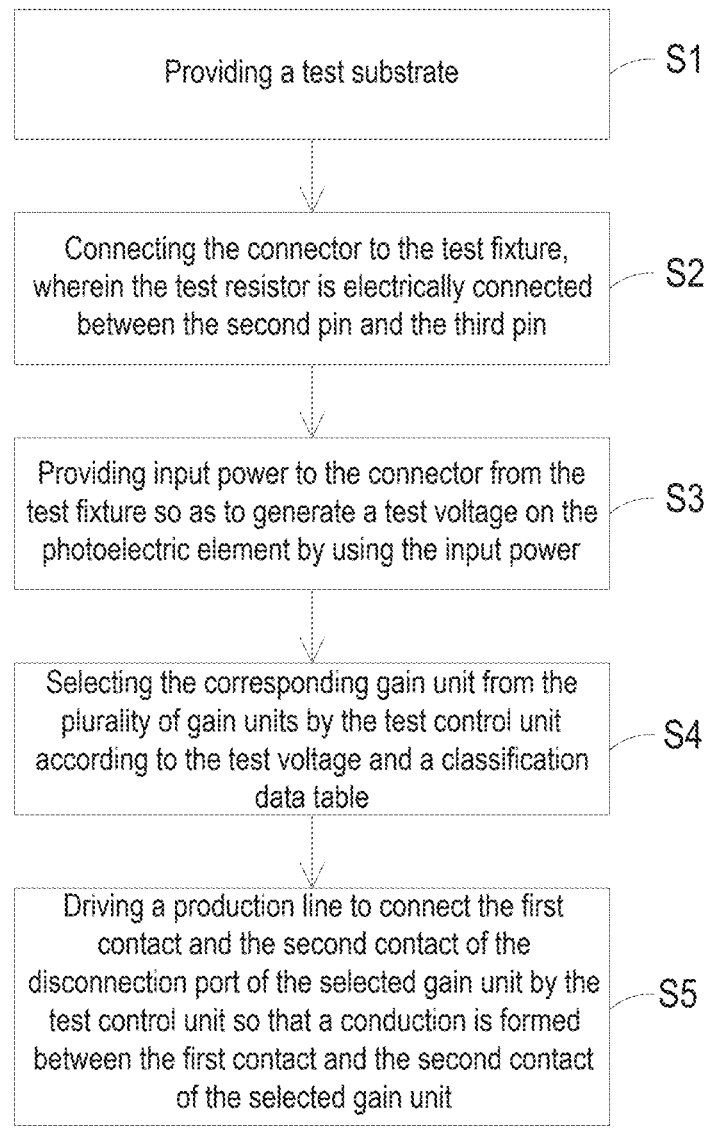
FIG. 1 is a flowchart illustrating a compensation method for characteristic differences of photoelectric elements according to an embodiment of the present invention.
Figure 2:
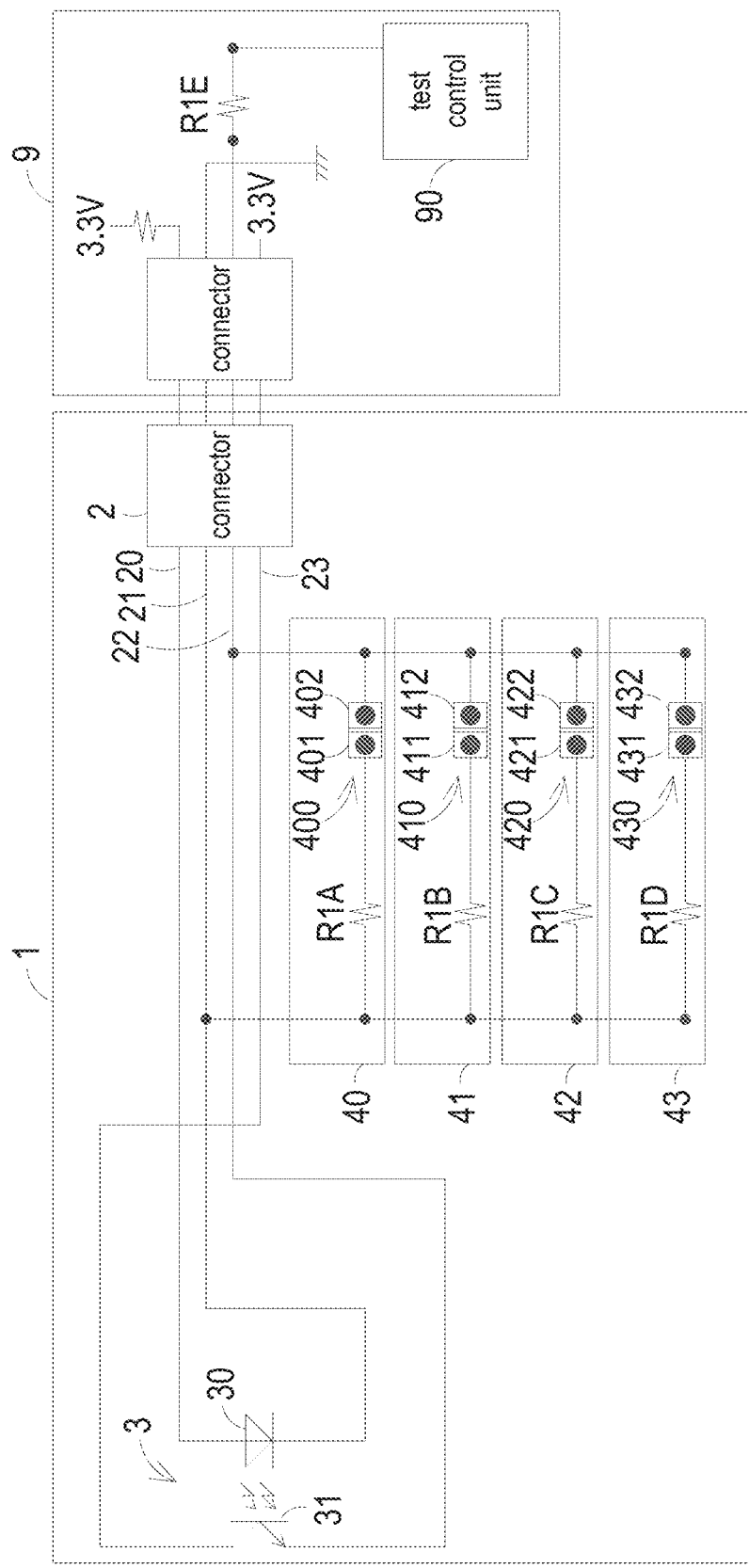
FIG. 2 is a schematic structural diagram illustrating a test substrate and a test fixture mentioned in FIG. 1.

FIG. 1 is a flowchart illustrating a compensation method for characteristic differences of photoelectric elements according to an embodiment of the present invention. FIG. 2 is a schematic structural diagram illustrating a test substrate and a test fixture mentioned in FIG. 1. As shown in FIGS. 1 and 2, the compensation method for characteristic differences of photoelectric elements of the present invention is performed by using a test substrate 1 and a test fixture 9 to achieve the effect of compensating the characteristic differences of the photoelectric elements. As shown in FIG. 2, the test substrate 1 of the present invention is tested by using the test fixture 9. Consequently, the intensity of an output signal of the photoelectric element 3 on the test substrate 1 is accessed, and then the characteristic differences of different photoelectric elements 3 are compensated according to the difference of the intensity of the output signal of different photoelectric elements 3.

The test substrate 1 includes a connector 2, a photoelectric element 3 and a plurality of gain units. The connector 2 is configured to connect with the test fixture 9 and includes a first pin 20, a second pin 21, a third pin 22 and a fourth pin 23. When the connector 2 is connected with the test fixture 9, the test fixture 9 provides the input power to the connector 2 through the first pin 20. The second pin 21 is a ground terminal.

The photoelectric element 3 is replaceably disposed on the test substrate 1. In this embodiment, the photoelectric element 3 is an optocoupler, wherein the photoelectric element 3 includes a light emitting diode 30 and a photoelectric transistor 31. An anode of the light emitting diode 30 is electrically connected with the first pin 20 of the connector 2, and a cathode of the light emitting diode 30 is electrically connected with the second pin 21 of the connector 2. A collector of the photoelectric transistor 31 is electrically connected with the fourth pin 23 of the connector 2, and an emitter of the photoelectric transistor 31 is electrically connected with the third pin 22 of the connector 2.

The plurality of gain units are electrically connected in parallel between the second pin 21 and the third pin 22 of the connector 2. The number of the plurality of gain units can be, for example, four gain units as shown in FIG. 1. The four gain units includes a first gain unit 40, a second gain unit 41, a third gain unit 42 and a fourth gain unit 43. The first gain unit 40 is electrically connected between the second pin 21 and the third pin 22 of the connector 2, and includes a first gain resistor R1A and a first disconnection port 400. The first gain resistor R1A is electrically connected with the first disconnection port 400. The first disconnection port 400 includes a first contact 401 and a second contact 402. The first contact 401 and the second contact 402 are disconnected from each other.

The second gain unit 41 is electrically connected between the second pin 21 and the third pin 22 of the connector 2, and includes a second gain resistor R1B and a second disconnection port 410. The second gain resistor R1B is electrically connected with the second disconnection port 410. The second disconnection port 410 includes a first contact 411 and a second contact 412. The first contact 411 and the second contact 412 are disconnected from each other.

The third gain unit 42 is electrically connected between the second pin 21 and the third pin 22 of the connector 2, and includes a third gain resistor R1C and a third disconnection port 420. The third gain resistor R1C is electrically connected with the third disconnection port 420. The third disconnection port 420 includes a first contact 421 and a second contact 422. The first contact 421 and the second contact 422 are disconnected from each other.

The fourth gain unit 43 is electrically connected between the second pin 21 and the third pin 22 of the connector 2, and includes a fourth gain resistor R1D and a fourth disconnection port 430. The fourth gain resistor R1D is electrically connected with the fourth disconnection port 430. The fourth disconnection port 430 includes a first contact 431 and a second contact 432. The first contact 431 and the second contact 432 are disconnected from each other.

In the above-mentioned embodiment, the resistance values of the first gain resistor R1A, the second gain resistor R1B, the third gain resistor R1C and the fourth gain resistor R1D are all different. For example, the resistance value of the first gain resistor R1A<the resistance value of the second gain resistor R1B<the resistance value of the third gain resistor R1C<the resistance value of the fourth gain resistor R1D.

The test fixture 9 includes a test resistor R1E and a test control unit 90. When the test fixture 9 is connected with the connector 2, the test resistor RE is electrically connected between the second pin 21 and the third pin 22 of the connector 2. In addition, when the test fixture 9 is connected with the connector 2, the input power is supplied to the first pin 20 from the test fixture 9 and drives the light emitting diode 30 to light up, so that a photocurrent is generated between the collector and the emitter of the photoelectric transistor 31. The photocurrent passes through the test resistor R1E through the third pin 22 to generate a test voltage, which is provided to the test control unit 90. In this embodiment, the test resistor R1E is used as an amplifier. The test control unit 90 pre-stores a classification data table, and the classification data table at least records the resistance values of all the gain resistors of the plurality of gain units, the classification of the intensity of the output signal of the photoelectric element 3 and the gain resistor of the gain unit corresponding to each classification.

When the control unit 90 receives the test voltage, the control unit 90 classifies the intensity of the output signal of the photoelectric element 3 on the test substrate 1 according to the classification data table, and selects the corresponding gain unit from the plurality of the gain units according to the classification result and the classification data table. The control unit 90 drives a production line to connect the first contact and the second contact of the disconnection port of the selected gain unit, so that a conduction is formed between the first contact and the second contact of the selected gain unit. The method of connecting the first contact and the second contact of the disconnection port is performed by using a jumper wire or a short-circuit cap, but it is not limited thereto. Therefore, the output signal of the photoelectric element 3 is compensated for the characteristic difference through the gain resistor of the corresponding gain unit.

In the above-mentioned embodiment, the resistance value of the test resistor R1E can be different from the resistance values of the first gain resistance R1A, the resistance values of the second gain resistance R1B, the resistance values of the third gain resistance R1C and the resistance values of the fourth gain resistance R1D. For example, the resistance value of the test resistance R1E<the resistance value of the first gain resistance R1A<the resistance value of the second gain resistor R1B<the resistance value of the third gain resistor R1C<the resistance value of the fourth gain resistor R1D.

In some embodiments, the input power provided from the test fixture 9 to the first pin 20 may be 10 mA. The intensity of the output signal of the photoelectric element 3 is in the range between 0.08 mA and 0.8 mA. The resistance value of the first gain resistor R1A is 3.32 KOhm. The resistance value of the second gain resistor R1B is 6.04 KOhm. The resistance value of the third gain resistor R1C is 10 KOhm. The resistance value of the fourth gain resistor R1D is 15 KOhm.

The compensation method for characteristic differences of photoelectric elements includes the following steps.

Firstly, in a step S1, the test substrate 1 is provided.

Then, in a step S2, the connector 2 of the test substrate 1 is connected with the test fixture 9.

Then, in a step S3, the test fixture 9 provides the input power to the connector 2 so as to generate the test voltage on the photoelectric element 3 by the input power.

Then, in a step S4, the test control unit 90 receives the test voltage, and selects the corresponding gain unit from the plurality of gain units according to the classification data table and the test voltage.

Then, in a step S5, the test control unit 90 drives the production line to connect the first contact and the second contact of the disconnection port of the selected gain unit, so that a conduction is formed between the first contact and the second contact.

Table 1 shows the classification principle of the test control unit 90 and parameters of related voltage and current. When the test control unit 90 receives the test voltage, the test control unit 90 accesses the intensity of the output signal of the photoelectric element 3 on the test substrate 1 according to the classification data table, and classifies the photoelectric element 3 according to the intensity of the output signal of the photoelectric element 3. Then, the test control unit 90 further selects the corresponding gain unit from the plurality of the gain units according to the classification result and the classification data table. For example, when the test control unit 90 accesses that the photocurrent generated by the photoelectric transistor 31 is between an upper limit and a lower limit of classification A according to the test voltage, the test control unit 90 selects the first gain unit 40 with the first gain resistor RIA, so that the test control unit 90 drives the production line to connect the first contact 401 and the second contact 402 of the first disconnection port 400 of the first gain unit 40. When the test control unit 90 accesses that the photocurrent generated by the photoelectric transistor 31 is between an upper limit and a lower limit of classification B according to the test voltage, the test control unit 90 selects the second gain unit 41 with the second gain resistor R1B, so that the test control unit 90 drives the production line to connect the first contact 411 and the second contact 412 of the second disconnection port 410 of the second gain unit 41. When the test control unit 90 accesses that the photocurrent generated by the photoelectric transistor 31 is between an upper limit and a lower limit of classification C according to the test voltage, the test control unit 90 selects the third gain unit 42 with the third gain resistor R1C, so that the test control unit 90 drives the production line to connect the first contact 421 and the second contact 422 of the third disconnection port 420 in the third gain unit 42. When the test control unit 90 accesses that the photocurrent generated by the photoelectric transistor 31 is between an upper limit and a lower limit of the classification D according to the test voltage, the test control unit 90 selects the fourth gain unit 43 with the fourth gain resistor R1D, so that the test control unit 90 drives the production line to connect the first contact 431 and the second contact 432 of the fourth disconnection port 430 of the fourth gain unit 43.

TABLE 1

| Classification | | Photocurrent measured by test fixture (mA) | Resistance of gain resistor (Kohm) | Output voltage (V) |
|---|---|---|---|---|
| A | Upper limit | 0.80 | 3.32 | 3.205792 |
|   | Lower limit | 0.44 | | 1.7631856 |
| B | Upper limit | 0.44 | 6.04 | 3.2077232 |
|   | Lower limit | 0.27 | | 1.9683756 |
| C | Upper limit | 0.27 | 10 | 3.2589 |

TABLE 1-continued

| Classification | | Photocurrent measured by test fixture (mA) | Resistance of gain resistor (Kohm) | Output voltage (V) |
|---|---|---|---|---|
|   | Lower limit | 0.18 | | 2.1726 |
| D | Upper limit | 0.18 | 15 | 3.2589 |
|   | Lower limit | 0.10 | | 1.8105 |

According to table 1, even if the difference between the maximum value and the minimum value of the output signal range recorded in the specification of the photoelectric element 3 is reached to 10 times, in the present invention, the characteristic difference of the photoelectric element 3 is compensated by the selected gain resistor so that the output voltage of the photoelectric element 3 in each classification can be controlled in a range between 1.76V and 3.26V, that is, the characteristic difference between the photoelectric elements 3 can be controlled within the range of 3.26/1.76=1.85 times. Therefore, the characteristic difference compensation method of the photoelectric element in the present invention can overcome the characteristic difference of the photoelectric element 3 so that the products have stable quality.

In some other embodiments, if there is an application requirement that needs to be more accurate (smaller difference multiples), the characteristic difference between the photoelectric elements 3 can be made more precisely by increasing the number of the gain units (for example, increasing the number of the gain unit from 4 to 10).

In summary, the present invention provides a compensation method for characteristic differences of the photoelectric elements. The compensation method utilizes the test fixture to generate the test voltage on the photoelectric element on test substrates. The test fixture selects the corresponding gain unit from the plurality of the gain units according to the classification data table and the test voltage, and connects the first contact and the second contact of the disconnection port of the selected gain unit, so that a conduction is formed between the first contact and the second contact of the selected gain unit. The characteristic difference of the photoelectric element is compensated by using the gain resistor of the selected gain unit, so as to overcome the characteristic difference between the photoelectric element and ensure the quality and the stable operation of the electronic equipment or the system.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A compensation method for a characteristic difference of a photoelectric element, comprising:
    (S1) providing a test substrate, wherein the test substrate comprises a connector, the photoelectric element and a plurality of gain units, wherein the photoelectric element is electrically connected with the connector, the connector comprises a first pin, a second pin, a third pin and a fourth pin, and the plurality of gain units are electrically connected in parallel, wherein each of the plurality of gain units is electrically connected between the second pin and the third pin, and comprises a gain resistor and a disconnection port, wherein the gain resistor is electrically connected to the disconnection port, the disconnection port comprises a first contact and a second contact which are disconnected from each other;

(S2) connecting the connector to a test fixture, wherein the test fixture comprises a test resistor and a test control unit, wherein when the test fixture is connected with the connector, the test resistor is electrically connected between the second pin and the third pin;

(S3) providing input power to the connector from the test fixture so as to generate a test voltage on the photoelectric element by using the input power;

(S4) selecting the corresponding gain unit from the plurality of gain units by the test control unit according to the test voltage and a classification data table; and (S5) driving a production line to connect the first contact and the second contact of the disconnection port of the selected gain unit by the test control unit so that a conduction is formed between the first contact and the second contact of the selected gain unit;

wherein the plurality of gain units include a first gain unit, a second gain unit, a third gain unit and a fourth gain unit, wherein the first gain unit, the second gain unit, the third gain unit and the fourth gain unit are connected in parallel, wherein the first gain unit comprises a first gain resistor and a first disconnection port, the second gain unit comprises a second gain resistor and a second disconnection port, the third gain unit comprises a third gain resistor and a third disconnection port, and the fourth gain unit comprises a fourth gain resistor and a fourth disconnection port;

wherein the input power is 10 mA, the intensity of an output signal of the photoelectric element is in a range between 0.08 mA and 0.8 mA, the resistance value of the first gain resistor is 3.32 KOhm, the resistance value of the second gain resistor is 6.04 KOhm, and the resistance value of the third gain resistor is 10 KOhm, and the resistance value of the fourth gain resistor is 15 KOhm.

2. The compensation method according to claim 1, wherein a resistance value of the selected gain resistor of one of the plurality of gain units is different from the resistance value of the gain resistor of the other of the plurality of gain units and the resistance value of the test resistor.

3. The compensation method according to claim 1, wherein the photoelectric element is an optocoupler, and comprises a light emitting diode and a photoelectric transistor, wherein an anode of the light emitting diode is electrically connected with the first pin, and a cathode of the light emitting diode is electrically connected with the second pin, wherein a collector of the photoelectric transistor is electrically connected with the fourth pin, and an emitter of the photoelectric transistor is electrically connected with the third pin.

4. The compensation method according to claim 3, wherein in the step (S3), the test fixture provides the input power through the first pin.

5. The compensation method according to claim 1, wherein the classification data table at least-records the resistance values of all the gain resistors of the plurality of gain units, the classification of the intensity of an output signal of the photoelectric element, and the gain resistance of the gain unit corresponding to each classification.

6. The compensation method according to claim 1, wherein in the step (S5), the production line uses a jumper wire or a short cap to connect the first contact and the second contact of the disconnected port of the selected gain unit.

* * * * *